United States Patent [19]

Calvignac et al.

[11] Patent Number: 4,964,127
[45] Date of Patent: Oct. 16, 1990

[54] DATA VALIDITY CHECKING MEANS

[75] Inventors: Jean Calvignac, LaGaude; Michel Dauphin; Raymond Lenoir, both of Vence; Jean-Louis Picard, LaColle sur Loup, all of France

[73] Assignee: International Business Machines Corporation, Armonk, N.Y.

[21] Appl. No.: 266,961

[22] Filed: Nov. 3, 1988

[30] Foreign Application Priority Data

Nov. 27, 1987 [EP] European Pat. Off. ........ 87480019.6

[51] Int. Cl.$^5$ ............................................. G06F 11/10
[52] U.S. Cl. .................................................. 371/37.1
[58] Field of Search .................... 371/37.1, 49.1, 51.1

[56] References Cited

U.S. PATENT DOCUMENTS 4,577,313 3/1986 Sy .......................................... 370/88
4,720,829 1/1988 Fukasawa et al. ................... 371/2.1
4,841,526 6/1989 Wilson et al. ......................... 371/32

Primary Examiner—Charles E. Atkinson
Attorney, Agent, or Firm—Joscelyn G. Cockburn

[57] ABSTRACT

A data handling system wherein data are arranged into frames including an information data section and a frame check sequence (FCS) section, and wherein a stamp section has to be appended/deleted from said frame. The stamp appending is operated without any FCS updating being required by appending to each stamp, a so called precomputed and stored anti-stamp.

18 Claims, 2 Drawing Sheets

DATA VALIDITY CHECKING MEANS

FIELD OF INVENTION

This invention deals with improvements to data handling systems including means for ensuring frames transfer integrity.

BACKGROUND OF THE INVENTION

Data integrity is a major concern wherever data is to be transfered within a system. For instance, in communication networks data sent from an originating source terminal to a destination terminal may flow through a network including several intermediate nodes, over paths including several physical links.

Said data may be altered anywhere along its path and one should be able to detect alteration and discard the corresponding data.

In networks wherein HDLC or SDLC data packing techniques (both herein refered to as HDLC) are used, each data frame is provided with a data dependent frame check sequence (FCS) made to enable checking data integrity throughout the data path. After each data modification, the FCS should normally be updated.

The FCS sequence generation is performed through polynomial division operations adding to the system data handling and processing load. Methods for simplifying FCS updating operations are of great interest.

In several applications, like for instance in communication networks, the transmitted message frame includes information data and a so called header embedded into the frame and made to help the transmitted frame find its way within the network. This routing data may be modified throughout the network, and therefore the corresponding frame FCS needs be updated, accordingly.

In some instances the header modifications are limited to a predetermined section of the header being simply inserted or deleted.

One object of this invention is to provide a method for optimizing the FCS updating process for a frame a section of which is to be deleted or inserted somewhere along the frame path within the system, without altering the FCS checking efficiency.

This and other objects, characteristics and advantages of the present invention will be explained in the following, with reference to the attached drawings.

DESCRIPTION OF A PREFERRED EMBODIMENT

Figure 1:
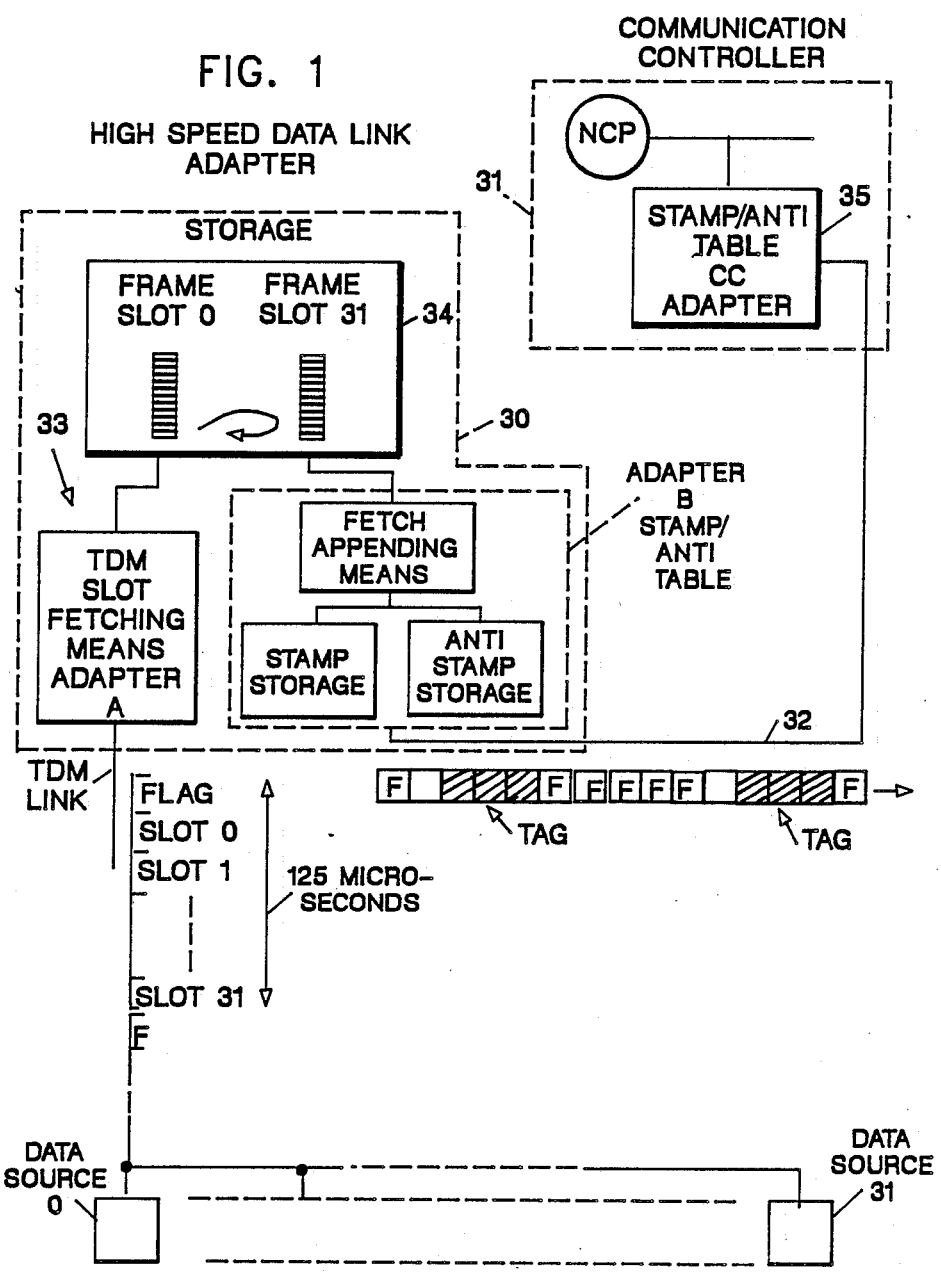
FIG. 1 is a schematic representation of a Communication System using the invention.

FIG. 1 shows a schematic representation of the elements of a communication network involved in this invention. It shows the system working one way (Receive), from which operation in the opposite direction (Transmit) may then be derived.

Figure 2:
FIG. 2 shows a TDM frame.

Thirty two originating terminals or other data sources operating at 64 kbps, provide, on a TDM link attached to the system, TDM frames each 128 microseconds long. Each frame (see FIG. 2), includes 33 slots, one for each terminal on a fixed predetermined relationship, plus one for a frame delimiting flag (F). The TDM link is attached to a High Speed Data Link adapter (HDLA) 30, wherein HDLC frames are to be reconstructed from the TDM frames, and then channelized up to a Communication Controller (CC) 31 over a high speed channel 32. The high speed channel may operate at 2048 Mbps for instance.

The TDM link is attached to the high speed data link adapter 30 through an adapter A of a set of adapters 33 wherein the TDM slots contents are fetched and oriented toward a data storage 34 and stored into buffer segments, say 256 bytes long. The frames are subjected there to chaining arrangement, e.g. to buffer chaining (chaining of buffer addresses), or to data chaining (queues). In any case, the originating TDM slot reference is still available at that level through knowledge of the chaining and storing parameters, i.e. addresses.

Figure 3:
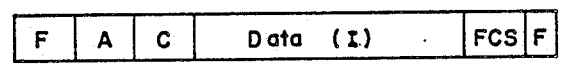
FIG. 3 represents a HDLC frame.

Adapter B, from the set of adapters 33, scans sequentially the storage chains. Whenever a complete HDLC frame is detected in the storage, it is to be forwarded over the high speed channel 32, up to the Communications Controller 31. For incomplete scanned frames, flags are provided to the high speed channel. The HDLC frames might be of fixed or variable length, but they all have the basic structure shown in FIG. 3. Said frame includes several fields respectively designated by F, A, C, Data, FCS and F.

The F fields are used for frame delimiters conventionally made to include flags represented by an hexadecimal "7E" byte.

A is an address field that identifies the frame destination station.

C is a control field that specifies the purpose of the considered frame. It is usually one byte long and may be in one of three formats : unnumbered format, supervisory format or information transfer format. Unnumbered format frames are used for such functions as initializing a destination secondary station (not shown); controlling the response mode of secondary stations; or reporting certain procedural errors. Supervisory formats are used to assist in the transfer of information in that they are used to confirm (ACK) preceding frames carrying information. The frames of the supervisory format do not carry pure information themselves. These frames are used to confirm received frames, convey ready or busy conditions, and to report frame numbering errors (indicating that a numbered information frame was received out of its proper sequence). Information transfer formats are used as vehicle for information transfer in SDLC. The control field besides indicating the format, contains send and receive count (Ns and Nr) which are used to ensure that these frames are received in their proper order (Ns) and to confirm accepted information frames (Nr). The Ns count indicates the number of the information frame whithin the sequence of information frames transmitted.

The information data field is a fixed or variable length (in multiples of 8-bit bytes) field made to include the information data, sometimes referred to as pure information data.

Following the information field is the Frame Check Sequence (FCS) field whose purpose is to enable checking the SDLC frame contents for error that may have occurred in the communication channel or anywhere along the transmission path, e.g. in storage (34) along the transfer path. This field contains a 16-bit check sequence that is the result of a computation on the contents of fields A, C and I operated before transmitting or forwarding any HDLC frame and appended to the frame.

A Network Control Program (NCP) located in the Communication Controller 31 controls the system operations and therefore checks the validity of each received HDLC frame through its FCS. Should it detect a frame numbering error, e.g. out of order, or an error detected through conventionnal FCS checking, process, then, NCP facilities would send a Non-Acknowledge (NOACK, e.g. in field C) indication back to the data source over high speed channel 32, adapter B, storage 34, adapter A and back to the TDM link.

Figure 4:
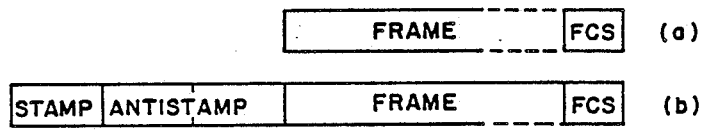
FIG. 4 shows a frame modified according to the invention.

For that purpose NCP needs to be informed of the source location or otherwise of the corresponding TDM Slot reference. This indication, apprehended through the TDM frame slot reference was normally available during said receive process, only up to the data stored in storage 34. To keep it still available to the Communication Controller, a so-called "stamp" data is attached (appended) to the original HDLC frame forwarded on the high speed channel 32, (see FIG. 4a and 4b). The "stamp" is inserted in Adapter B and removed from the frame in the Communication Controller (CC) Adapter 35, once the frame validity is checked. Since frame validity check is based on the frame FCS, to keep said FCS fully operative, one should normally update it after each stamp insertion or deletion. The additional data processing required for FCS updating is avoided here through use of an "anti-stamp" data inserted in the HDLC frames as shown in FIG. 4b. "Stamp" and anti-stamp" are made to neutralize their overall contribution to the whole HDLC FCS frame.

FCS generation is conventionally operated by polynomial divisions as explained hereunder.

Assuming that a HDLC frame contains "k" bits to be subjected to FCS checking and denoting the k bits by coefficients $a_{<k-1>}, \ldots, a_{<0>}$ defined as elements of Galois field of order 2, each equal to zero or one, the frame may be represented by a polynomial $P_{k-1}(x)$ $$P_{k-1}(x) = a_{k-1} \cdot x^{k-1} + a_{k-2} \cdot x^{k-2} + \ldots + a_1 x + a_0$$

The FCS of $P_{k-1}(x)$ conventionally involves computing remainders of polynomial divisions modulo 2 of $x^l \cdot P_{k-1}(x)$ by a so called generating polynomial $G(x)$ of degree "l", with l being a predetermined integer value. This generating polynomial is a predefined one, selected by the CCITT for instance.

The CCITT has defined a generating polynomial:

$$G(x) = x^{16} + x^{12} + x^5 + 1$$

The FCS is defined as the sum (modulo 2) of three terms:

$$FCS_k(x) = T1(x) + T2(x) + F15(x)$$

wherein:

$$F15(x) = x^{15} + x^{14} + x^{13} + \ldots + x^3 + x^2 + x + 1$$

$T1(x) = $ Remainder $(x^k \cdot F15(x), G(x))$ (i.e. the remainder of the division of $x^k \cdot F15(x)$ by $G(x)$ $T2(x) = $ Remainder $(x^{16} \cdot P_{k-1}(x), G(x))$ This FCS(x) represents a 16-bit long sequence with higher order coefficients first, and the polynomial finally transmitted within the HDLC frame in between flags is then:

$$Mt(x) = x^{16} \cdot P_{k-1}(x) + FCS_k(x)$$
$$= x^{16} \cdot P_{k-1}(x) + T1(x) + T2(x) + F15(x)$$

Let's assume a one byte "stamp" is now to be inserted ahead of the $P_{k-1}(x)$ frame. Let's assume also a two-byte long "anti-stamp" is appended to said "stamp". The stamp/anti-stamp tag (AH(x)) is then 24 bits long. The new FCS (with "k+24" bits) is :

$$FCS_{k+24}(x) = \text{Remainder } (x^{k+24} \cdot F15(x), G(x)) +$$
$$\text{Remainder } (x^{16} \cdot P_{k+23}(x), G(x)) +$$
$$F15(x)$$

The difference between both FCSs (i.e. original FCSk and $FCS_{k+24}$ for the three bytes tagged frame) is:

$$dFCS(x) = \text{Remainder } (x^k \cdot (x^{24}-1) \cdot F15(x), G(x))$$
$$+ \text{Remainder } (x^{16}(P_{k+23}(x) - P_{k-1}(x)), G(x))$$

but:

$$P_{k+23}(x) - P_{k-1}(x) = a_{k+23} x^{k+23} + a_{k+22} x^{k+22} + \ldots + a_k x^k$$
$$P_{k+23}(x) - P_{k-1}(x) = x^k \cdot (a_{k+23} x^{23} + a_{k+22} x^{22} + \ldots + a_k)$$

The part within parentheses is the polynomial representing the 24 bits added ahead of the frame AH(x). Since adding two remainders is congruent to their sum, the difference between both FCSs is:

$$dFCS(x) = \text{Remainder}$$
$$(x^k \cdot ((x^{24}-1) \cdot F15(x) + x^{16} \cdot AH(x)), G(x))$$

To keep the original FCS unchanged, the difference dFCS(x) has to be identically zero, that is:

$$x^k(x^{24}-1) \cdot F15(x) + x^{16} \cdot AH(x)) \text{ ident} = 0, \text{ mod } G(x)$$

As G(x) and $x^k$ have no common divisor, this is equivalent to:

$$(x^{24}-1) \cdot F15 + x^{16} AH(x) = 0 \qquad \text{mod } F(z)$$

This equality can be considered as an equation, in which the first 8 coefficients of AH(x), $a_{23}, \ldots, a_{16}$ are parameters and the last 16 coefficients $a_{15}, \ldots, a_0$ are the unknowns.

The division modulo G(x) results in a system of 16 linear equations. The determinant of this system is different from zero, thus there is exactly one solution for each set of values of the parameters.

These values have been computed and are recorded in the attached table.

The basic principle of the method to be used with this invention is such that whenever a frame provided with its FCS has to be appended, one additional byte (i.e. a "stamp") will also be provided with a 2-bytes long "anti-stamp" whose effect is to enable keeping the overall required FCS unchanged. In other words, the association stamp/anti-stamp has a neutral effect on the frame FCS.

This method enables savings on processing load in a number of applications.

The 2 bytes antistamp values for all possible 1-byte stamp expressed in hexadecimal have been computed (see attached TABLE).

In practice the TABLE will be stored in a random access memory located in both Adapter 33 B and CC Adapter 35.

In the receiving process from TDM link to Communications Controller, Adapter B scans the storage chains to fetch any HDLC frame therefrom, and forward it on High Speed channel 32. But prior to said forwarding, Adapter B should stamp the frame with a one-byte long word representing the TDM slot reference, (stamp) fetched from the TABLE stored into Adapter B.

But whenever said "stamp" has to be used, the corresponding anti-stamp would also be fetched from the TABLE and, appended to it as a tag within the frame as shown in FIG. 4b.

The stamp/anti-stamp tag is removed from the frame in the CC Adapter 35 once the frame is checked valid. Otherwise the stamp slot reference) is used to orient a TRANSMIT NOACK frame back to the originating terminal asking it to resend the same frame once more until finally checked valid.

This TRANSMIT operation is also performed by attaching a stamp/anti-stamp slot reference tag to a conventionnally shaped NOACK HDLC frame. This tag will be removed therefrom in Adapter B prior to storing the frame in storage 34. Adapter A uses then consecutive portions of said NOACK frame and insert these into predetermined TDM slots, over the TDM link back to the originating terminal.

Obviously, the method is neither limited to a one-byte stamp, nor to a stamp located ahead of the frame. It could be extended to multi-byte stamps or to differently located stamps.

TABLE

| Stamp byte | Anti-bytes | Stamp byte | Anti-bytes | Stamp byte | Anti-bytes | Stamp byte | Anti-bytes |
|---|---|---|---|---|---|---|---|
| "00" | "653F" | "40" | "2DFB" | "80" | "F4B7" | "C0" | "BC73" |
| "01" | "751E" | "41" | "3DDA" | "81" | "E496" | "C1" | "AC52" |
| "02" | "457D" | "42" | "0DB9" | "82" | "D4F5" | "C2" | "9C31" |
| "03" | "555C" | "43" | "1D98" | "83" | "C4D4" | "C3" | "8C10" |
| "04" | "25BB" | "44" | "6D7F" | "84" | "B433" | "C4" | "FCF7" |
| "05" | "359A" | "45" | "7D5E" | "85" | "A412" | "C5" | "ECD6" |
| "06" | "05F9" | "46" | "4D3D" | "86" | "9471" | "C6" | "DCB5" |
| "07" | "15D8" | "47" | "5D1C" | "87" | "8450" | "C7" | "CC94" |
| "08" | "E437" | "48" | "ACF3" | "88" | "75BF" | "C8" | "3D7B" |
| "09" | "F416" | "49" | "BCD2" | "89" | "659E" | "C9" | "2D5A" |
| "0A" | "C475" | "4A" | "8CB1" | "8A" | "55FD" | "CA" | "1D39" |
| "0B" | "D454" | "4B" | "9C90" | "8B" | "45DC" | "CB" | "0D18" |
| "0C" | "A4B3" | "4C" | "EC77" | "8C" | "353B" | "CC" | "7DFF" |
| "0D" | "B492" | "4D" | "FC56" | "8D" | "251A" | "CD" | "6DDE" |
| "0E" | "84F1" | "4E" | "CC35" | "8E" | "1579" | "CE" | "5DBD" |
| "0F" | "94D0" | "4F" | "DC14" | "8F" | "0558" | "CF" | "4D9C" |
| "10" | "770E" | "50" | "3FCA" | "90" | "E686" | "D0" | "AE42" |
| "11" | "672F" | "51" | "2FEB" | "91" | "F6A7" | "D1" | "BE63" |
| "12" | "574C" | "52" | "1F88" | "92" | "C6C4" | "D2" | "8E00" |
| "13" | "476D" | "53" | "0FA9" | "93" | "D6E5" | "D3" | "9E21" |
| "14" | "378A" | "54" | "7F4E" | "94" | "A602" | "D4" | "EEC6" |
| "15" | "27AB" | "55" | "6F6F" | "95" | "B623" | "D5" | "FEE7" |
| "16" | "17C8" | "56" | "5F0C" | "96" | "8640" | "D6" | "CE84" |
| "17" | "07E9" | "57" | "4F2D" | "97" | "9661" | "D7" | "DEA5" |
| "18" | "F606" | "58" | "BEC2" | "98" | "678E" | "D8" | "2F4A" |
| "19" | "E627" | "59" | "AEE3" | "99" | "77AF" | "D9" | "3F6B" |
| "1A" | "D644" | "5A" | "9E80" | "9A" | "47CC" | "DA" | "0F08" |
| "1B" | "C665" | "5B" | "8EA1" | "9B" | "57ED" | "DB" | "1F29" |
| "1C" | "B682" | "5C" | "FE46" | "9C" | "270A" | "DC" | "6FCE" |
| "1D" | "A6A3" | "5D" | "EE67" | "9D" | "372B" | "DD" | "7FEF" |
| "1E" | "96C0" | "5E" | "DE04" | "9E" | "0748" | "DE" | "4F8C" |
| "1F" | "86E1" | "5F" | "CE25" | "9F" | "1769" | "DF" | "5FAD" |
| "20" | "415D" | "60" | "0999" | "A0" | "D0D5" | "E0" | "9811" |
| "21" | "517C" | "61" | "19B8" | "A1" | "C0F4" | "E1" | "8830" |
| "22" | "611F" | "62" | "29DB" | "A2" | "F097" | "E2" | "B853" |
| "23" | "713E" | "63" | "39FA" | "A3" | "E0B6" | "E3" | "A872" |
| "24" | "01D9" | "64" | "491D" | "A4" | "9051" | "E4" | "D895" |
| "25" | "11F8" | "65" | "593C" | "A5" | "8070" | "E5" | "C8B4" |
| "26" | "219B" | "66" | "695F" | "A6" | "B013" | "E6" | "F8D7" |
| "27" | "31BA" | "67" | "797E" | "A7" | "A032" | "E7" | "E8F6" |
| "28" | "C055" | "68" | "8891" | "A8" | "51DD" | "E8" | "1919" |
| "29" | "D074" | "69" | "98B0" | "A9" | "41FC" | "E9" | "0938" |
| "2A" | "E017" | "6A" | "A8D3" | "AA" | "719F" | "EA" | "395B" |
| "2B" | "F036" | "6B" | "B8F2" | "AB" | "61BE" | "EB" | "297A" |
| "2C" | "80D1" | "6C" | "C815" | "AC" | "1159" | "EC" | "599D" |
| "2D" | "90F0" | "6D" | "D834" | "AD" | "0178" | "ED" | "49BC" |
| "2E" | "A093" | "6E" | "E857" | "AE" | "311B" | "EE" | "79DF" |
| "2F" | "B0B2" | "6F" | "F876" | "AF" | "213A" | "EF" | "69FE" |
| "30" | "536C" | "70" | "1BA8" | "B0" | "C2E4" | "F0" | "8A20" |
| "31" | "434D" | "71" | "0B89" | "B1" | "D2C5" | "F1" | "9A01" |
| "32" | "732E" | "72" | "3BEA" | "B2" | "E2A6" | "F2" | "AA62" |
| "33" | "630F" | "73" | "2BCB" | "B3" | "F287" | "F3" | "BA43" |
| "34" | "13E8" | "74" | "5B2C" | "B4" | "8260" | "F4" | "CAA4" |
| "35" | "03C9" | "75" | "4B0D" | "B5" | "9241" | "F5" | "DA85" |
| "36" | "33AA" | "76" | "7B6E" | "B6" | "A222" | "F6" | "EAE6" |
| "37" | "238B" | "77" | "6B4F" | "B7" | "B203" | "F7" | "FAC7" |
| "38" | "D264" | "78" | "9AA0" | "B8" | "43EC" | "F8" | "0B28" |

TABLE-continued

| Stamp byte | Anti-bytes | Stamp byte | Anti-bytes | Stamp byte | Anti-bytes | Stamp byte | Anti-bytes |
|---|---|---|---|---|---|---|---|
| "39" | "C245" | "79" | "8A81" | "B9" | "53CD" | "F9" | "1B09" |
| "3A" | "F226" | "7A" | "BAE2" | "BA" | "63AE" | "FA" | "2B6A" |
| "3B" | "E207" | "7B" | "AAC3" | "BB" | "738F" | "FB" | "3B4B" |
| "3C" | "92E0" | "7C" | "DA24" | "BC" | "0368" | "FC" | "4BAC" |
| "3D" | "82C1" | "7D" | "CA05" | "BD" | "1349" | "FD" | "5B8D" |
| "3E" | "B2A2" | "7E" | "FA66" | "BE" | "232A" | "FE" | "6BEE" |
| "3F" | "A283" | "7F" | "EA47" | "BF" | "330B" | "FF" | "7BCF" |

We claim:

1. System wherein data are arranged into frames including a data section and a data dependent Frame Check Sequence (FCS), and wherein a so called stamp section is to be appended to said data section including:
   means for storing an anti-stamp section made to neutralize the contribution of said stamp section to said FCS; and
   means for concatenating said anti-stamp section to said stamp section, whereby a tag is generated; and appending said tag to said data section.

2. A system according to claim 1 wherein said frames are of the HDLC/SDLC type.

3. A system according to claim 1 or 2 wherein said FCS is the remainder of the division of a polynomial representation of said data section by a predetermined generating polynomial G(x).

4. System according to claim 3 wherein said stamp is a one-byte long term to be inserted ahead of the frame.

5. A system according to claim 4 wherein said anti-stamp is a predetermined stored two-bytes long term.

6. A data communication system including means for converting TDM multiplexed data embedded into TDM slots into HDLC data frames including a data section and a data dependent Frame Check Sequence (FCS) section, said system including:
   stamp storage means for storing a so called stamp representing the TDM slot reference corresponding to each HDLC frame;
   anti-stamp storage means for storing predetermined stamp dependent anti-stamp data;
   tag means for generating tags by appending an anti-stamp to each corresponding stamp; and
   appending a tag to each HDLC frame,
   whereby said HDLC FCS section is kept unchanged.

7. A data communication system according to claim 6 wherein said tag is appended ahead of the HDLC/SDLC frame.

8. A data communication system according to claim 7 wherein said stamp is one-byte long and said anti-stamp two bytes long.

9. A data communication system according to claims 6 wherein said means for converting TDM data into HDLC/SDLC frames is a High Speed Data Link Adapter including:
   a TDM link to be provided with the TDM data frames;
   a first adapter attached to said link;
   storage means;
   means within said first adapter for fetching each TDM slot data contents on said TDM link and for recombining HDLC/SDLC frames through chaining operations;
   a second adapter including said stamp and anti-stamp storage means, and means for fetching said recombined HDLC/SDLC frames from said storage means and appending therein stamp/anti-stamp data;
   a high speed data link connected to said second adapter for being fed with said stamped/anti-stamped HDLC/SDLC frames.

10. In a communications network having a plurality of data sources coupled by a TDM link to a High Speed Data Link Adapter (HDLA) which is coupled by a High Speed Channel to a communications controller, an apparatus for generating an improved frame which transports information within said network comprising;
    means, at said HDLA or said communications controller, for generating the improved frame including a first section and a remainder second section concatenated to said first section, said first section having a first field carrying characters whose values are representative of a slot position which the second section occupies in a TDM frame on the TDM link, and a second field concatenated to said first field; said second field carrying characters whose value neutralizes that of the characters in the first field so that an FCS of the second section is unaffected by the characters.

11. In a computer system wherein information is packaged into a frame that is transported between a receiving entity and a transmitting entity of said system a method for improved communications between said entity comprising the steps of:
    (a) at a transmitting entity, generating a stamp with a data value representing an originating source of the frame;
    (b) generating an anti-stamp with a data value which neutralizes the contribution of said stamp to an FCS of said frame;
    (c) concatenating the stamp and anti-stamp to generate a tag; and
    (d) appending the tag to the frame to generate a super-frame.

12. The method of claim 11 further including the steps of:
    (e) forwarding the super-frame from the said transmitting entity to the receiving entity;
    (f) receiving the super-frame at the receiving entity;
    (g) checking the super-frame for validity; and
    (h) removing the tag only if the frame is checked valid, otherwise using the stamp to route a "Transmit No Ack" frame to an originating data source requesting it to resend the frame.

13. An improved communications system for packaging and transmitting data provided on a TDM link from a plurality of data terminals comprising:
    an apparatus for receiving said data from said TDM link; said apparatus having a first means for converting TDM multiplexed data embedded into TDM slots into data frames having a first section and a dependent Frame Check Sequence (FCS);
    a storage means coupled to said first means;

said storage means storing the data frames; and
a second means coupled to said storage means;
said second means extracting data frames from said storage means and tagging each frame with a tag having a section with a first value identifying a slot that the frame occupies on the TDM link and a section with a second value neutralizing the first value so that the tag does not affect the FCS.

14. The improved communications system of claim 13 wherein the data frames are arranged in HDLC format.

15. The improved communications system of claim 13 wherein the data frames are of the SDLC type.

16. The improved communications system of claim 13 further including a communications controller having means for receiving data frames from the apparatus, checking each frame and removing the tag only if a frame is checked valid, otherwise using the tag to route a response frame to an originating data source requesting it to resend the frame.

17. The improved communications system of claim 16 further including a communications channel interconnecting the communications controller and the apparatus.

18. An improved adapter for use in a system wherein data are arranged into frames each one having a first section and a FCS whose value is dependent on the contents of said first section concatenated to said first section, said adapter comprising:
    means for storing a stamp whose value represents a source that originates a frame;
    means for storing an anti-stamp whose value is made to neutralize the contribution of said first stamp to said FCS; and
    means for appending the stamp and anti-stamp to the frame.

* * * * *